(12) United States Patent
Jalla

(10) Patent No.: US 11,113,310 B2
(45) Date of Patent: Sep. 7, 2021

(54) METHOD AND SYSTEM FOR IDENTIFYING ISSUES AND CONFLICTS WITH BUILDING CONSTRUCTION

(71) Applicant: Consulting Engineers, Corp., Reston, VA (US)

(72) Inventor: Maharaj Jalla, Great Falls, VA (US)

(*) Notice: Subject to any disclaimer, the term of this patent is extended or adjusted under 35 U.S.C. 154(b) by 0 days.

(21) Appl. No.: 16/677,639

(22) Filed: Nov. 7, 2019

(65) Prior Publication Data

US 2021/0141805 A1 May 13, 2021

(51) Int. Cl.
  *G06F 16/27* (2019.01)
  *G06Q 50/16* (2012.01)
  *G06F 16/23* (2019.01)

(52) U.S. Cl.
  CPC ........ *G06F 16/273* (2019.01); *G06F 16/2329* (2019.01); *G06F 16/2365* (2019.01); *G06Q 50/165* (2013.01)

(58) Field of Classification Search
  CPC .............. G06F 16/273; G06F 16/2329; G06F 16/2365; G06F 16/27; G06F 16/23; G06Q 50/165; G06Q 50/16
  See application file for complete search history.

(56) References Cited

U.S. PATENT DOCUMENTS

| | | | | |
|---|---|---|---|---|
| 8,441,502 B2* | 5/2013 | Reghetti | ................. | G06F 30/00 345/635 |
| 8,600,706 B2* | 12/2013 | Reghetti | ................. | G06F 30/13 703/1 |
| 8,732,599 B2* | 5/2014 | Reghetti | ................. | G06T 19/20 715/765 |
| 10,373,183 B1* | 8/2019 | Jacobs, II | .......... | G06Q 30/0206 |
| 2004/0073410 A1* | 4/2004 | Maly | ...................... | G06F 30/13 703/1 |
| 2015/0254376 A1* | 9/2015 | Pettersson | .............. | G06Q 10/06 703/1 |
| 2016/0253445 A1* | 9/2016 | Pataky | .................... | G06F 30/33 716/104 |

OTHER PUBLICATIONS

Ilal, Sibel Macit, and H. Murat Günaydin. "Computer representation of building codes for automated compliance checking." Automation in Construction 82 (2017): 43-58. (Year: 2017).*
Lee, Ghang, Rafael Sacks, and Charles M. Eastman. "Specifying parametric building object behavior (BOB) for a building information modeling system." Automation in construction 15, No. 6 (2006): 758-776. (Year: 2006).*

* cited by examiner

*Primary Examiner* — Chuen-Meei Gan
(74) *Attorney, Agent, or Firm* — Andrew Morabito

(57) ABSTRACT

The present invention generally relates to the process of analyzing all systems and sub systems in the construction of a building to identify conflicts or design errors, and correcting the errors at the design stage so the construction can be completed with minimal or no issues. Through the analysis of the framing, walls, windows, HVAC, plumbing, electrical and other systems or sub systems that are typical in the construction of a building, the framing can be designed to anticipate the HVAC and plumbing, and the frame members can be built with the cutouts or contours to accommodate these systems. The present Invention uses the unique feature of conflict check in which the members or elements which has conflict are identified and a list of all conflict members is prepared. The List also shows the condition under which the given conflict occurs.

14 Claims, 20 Drawing Sheets

METHOD AND SYSTEM FOR IDENTIFYING ISSUES AND CONFLICTS WITH BUILDING CONSTRUCTION

BACKGROUND

This disclosure relates generally to building construction and in particular, to the method, computer program, or computer system for providing the quality control of the material for the building construction and determining conflicts within the building construction.

building construction is a complicated process in which multiple disciplines are involved like architectural system which includes the Building finishes, building fixed furniture arrangements, Structural system which includes the structural framing members in the building, Mechanical System which includes the Heating, Ventilation, and Air Conditioning (HVAC) machines, HVAC ducts, Heating units, Solar system and any other items which are covered under mechanical system, Electrical system which includes the electrical equipment, electrical ducting any other items which are covered under Electrical system, and plumbing system which includes the drainage pipes, drainage fixtures, sewage pipes, sewage fixtures any other items which are covered under plumbing system, and any other systems which are involved in Building Construction.

During building construction, the coordination between these multiple disciplines is very important point to be considered for hassle free construction. As all these disciplines are handled by different teams which are Architects, Civil Engineers, Mechanical Engineers, Electrical Engineers, Plumbing Engineers and other heads of any other system involved in building construction. The constructability of the building materials to avoid any conflict between any discipline is critical aspect. Traditional method of reviewing the constructability checks for each member manually in the detailing software is time consuming and chances of error are more.

Therefore, it is beneficial to assist each of these disciplines at the earliest stage to determine where issues exist and preemptively correcting these issues before construction begins.

SUMMARY

In a first embodiment, the present invention is a computer-implemented method comprising: receiving, by a computing device, a model, wherein the mode is comprised of a plurality of members; analyzing, by the computing device, each of the plurality of members and determining if any of the plurality of members have internal conflicts and external conflicts; identifying, by the computing device, each of the members which have an internal conflict and the members which have external conflicts; and generating, by the computing device, a sick of all members with conflicts.

In a second embodiment, the present invention is a computer program product, the computer program product comprising a computer readable storage medium having program instructions embodied therewith, the program instructions executable by a computing device to cause the computing device to: receive a model, wherein the mode is comprised of at least two individual members; analyze each of the at least two individual members and determining if at least one of the individual members has a conflict with any other members; identify each of the members which has a conflict; and generate a sick of all conflicting members.

In a third embodiment, the present invention is a system comprising: a CPU, a computer readable memory and a computer readable storage medium associated with a computing device; program instructions to identify each member in a model; program instructions to analyze each member of the model and determine if any members have a conflict with other members of the model; program instructions to identify the type of conflict with each member, wherein a conflict can be internal or external; and program instructions to generate a report of the members and the type of conflicts.

BRIEF DESCRIPTION OF THE DRAWINGS

Referring now to the drawings in which like reference numbers represent corresponding parts throughout.

DETAILED DESCRIPTION

Figure 1:
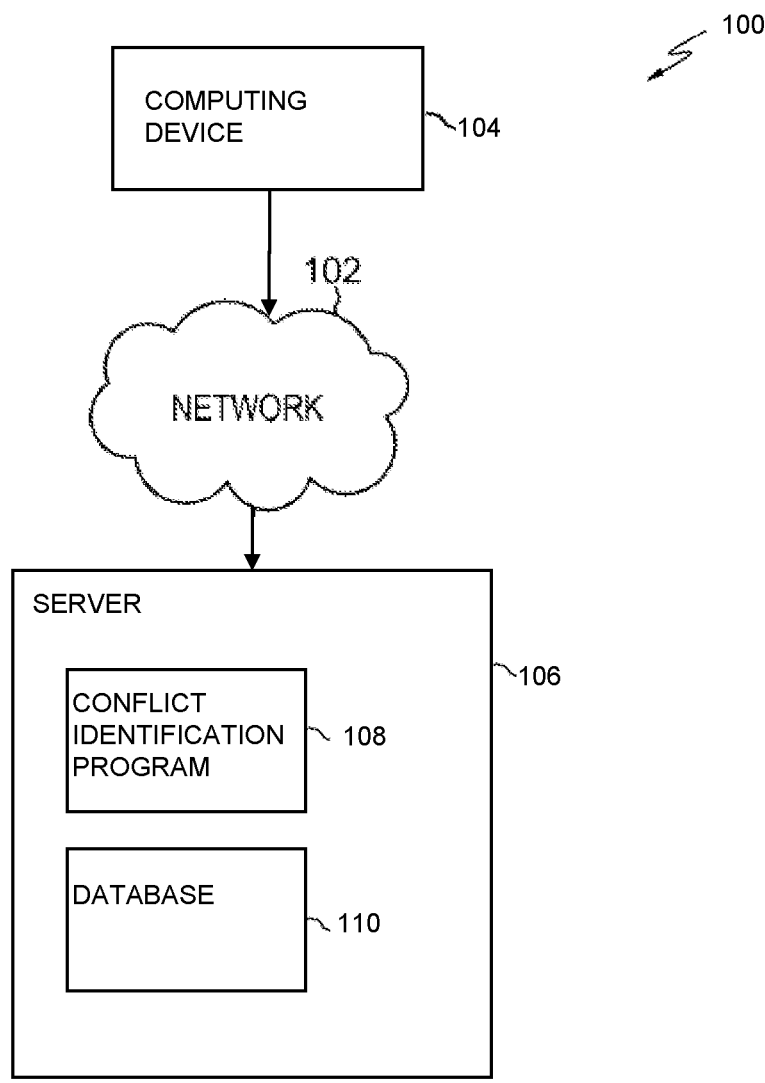
FIG. 1 depicts a block diagram depicting a computing environment, in accordance with one embodiment of the present invention.

The present invention generally relates to the process of analyzing all systems and sub systems in the construction of a building to identify conflicts or design errors, and correcting the errors at the design stage so the construction can be completed with minimal or no issues. Through the analysis of the framing, walls, windows, HVAC, plumbing, electrical and other systems or sub systems that are typical in the construction of a building, the framing can be designed to anticipate the HVAC and plumbing, and the frame members can be build with the cutouts or contours to accommodate these systems.

The present Invention uses the unique feature of conflict check in which the members or elements which has conflict are identified and a list of all conflict members is prepared. The List also shows the condition under which the given conflict occurs. The unique feature saves the time of review the building members and prepare conflict member list for formed steel members and also eliminate the changes of error.

In automation software, the review of the 3-Dimensional building model has been simplified by providing a unique process of constructability conflict check for of structural system, architectural system, mechanical system, electrical system and plumbing system. The components of these and other systems that are interfering with one another are identified and marked. These marked components are incorporated into a list ("sick list") which identifies these members, the conflicting members, and the condition under where the conflict is occurring.

In the process of creating a building, a 3-Dimentional model of the building is generated. The next step is to generate the manufacturing files for the roll forming machine creation. However, the generation of these manufacturing files is not advised or able to be completed until a verification of possible conflicts of the systems is completed. Otherwise the potential for cold formed steel stubs to be manufactured without the proper cutouts or design to accommodate the systems and either new parts need to be manufactured, or manual modification of the parts need to be completed on the job site. Both of these take time and additional resources to complete. The reviewing of the 3D or 2D model from constructability aspect and identify the possible conflicts is time consuming task before the cold formed steel studs are manufactured. If the checker can quickly identify the possible conflicts in the 3-Dimensional building model it can increase the speed of manufacturing, and having a program that highlights these conflicts only further increases the speed at which the project can be completed.

The present invention provides for an advantage of allowing the review of the drawings or models by providing a unique process of constructability conflict check for the structural system, architectural system, mechanical system, electrical system and plumbing system and the like. The members which are conflicting are identified and marked for the reviewer to easily identify and correct the conflicts. The conflicts can be identified during the process of building detailing by using the present inventions conflict check method and system.

The term "conflict" is used for any incidence or location or Event where any one material or element or member or equipment is not at the required position, not within the required specifications, not adhering to predetermined codes, or the like. Required position means the Global position of the material or element or member or equipment in reference of the Global X, Y, Z Axis. This is determined by the Architectural drawings and other Construction details related in the Building. Required specification means either the length of the Cold formed steel members, Cold formed steel Construction Tooling operations created using the roll forming machines. Predetermined codes means any state, local, or federal guidelines which are required to construct the building.

The unique process of constructability conflict check and sick list preparation has several advantages, save time for review of each element manually to identify constructability conflict checks. If the conflict is not checked before the start of construction of the building, it can create a lot of problems during the construction.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

FIG. 1 depicts a block diagram of a computing environment 100 in accordance with one embodiment of the present invention. FIG. 1 provides an illustration of one embodiment and does not imply any limitations regarding the environment in which different embodiments maybe implemented.

In the depicted embodiment, computing environment 100 includes network 102, computing device 104, and server 106. Computing environment 100 may include additional servers, computers, or other devices not shown.

Network 102 may be a local area network (LAN), a wide area network (WAN) such as the Internet, any combination thereof, or any combination of connections and protocols that can support communications between computing device 104 and server 106 in accordance with embodiments of the invention. Network 102 may include wired, wireless, or fiber optic connections.

Computing device 104 may be a management server, a web server, or any other electronic device or computing system capable of processing program instructions and receiving and sending data. In other embodiments, computing device 104 may be a laptop computer, tablet computer, netbook computer, personal computer (PC), a desktop computer, or any programmable electronic device capable of communicating with patient computing device 104 via network 102. In other embodiments, computing device 104 may be a server computing system utilizing multiple computers as a server system, such as in a cloud computing environment. In one embodiment, computing device 104 represents a computing system utilizing clustered computers and components to act as a single pool of seamless resources. Computing device 104 may include components, as depicted and described in further detail with respect to FIG. 1.

Server 106 may be a management server, a web server, or any other electronic device or computing system capable of processing program instructions and receiving and sending data. In other embodiments server 106 may be a laptop computer, tablet computer, netbook computer, personal computer (PC), a desktop computer, or any programmable electronic device capable of communicating via network 102. In one embodiment, server 106 may be a server computing system utilizing multiple computers as a server system, such as in a cloud computing environment. In one embodiment, server 106 represents a computing system utilizing clustered computers and components to act as a single pool of seamless resources. In the depicted embodiment conflict identification program 108 and database 110 are located on server 106. Server 106 may include components, as depicted and described in further detail with respect to FIG. 1.

Conflict Identification program 108 has the unique feature of constructability conflict check in which the structural, architectural, electrical, mechanical, plumbing systems, and the like are analyzed to determine where conflicts are present and identifies the members which are involved in the conflicts. The members which are conflicting with each other are added to a list ("sick list") which identifies all of the conflicting members. The Conflict can be between any material, component, member or the like which cannot be properly installed due to other material, components, or members which either interfere with one another or are not within the proper code requirements. The sick list shows the condition under which the member is conflicting in constructability conflict check, so personnel can easily make the necessary modifications to correct the conflicts and produce a model of the building without any conflicts.

For example, a conflict could be between cold formed steel elements overlapping with another cold formed steel element or cold formed steel element overlapping with mechanical duct. In both of these situations the parts cannot overlap and need to properly meet one another to be matted, or the parts cannot overlap and need to have unobstructed paths, respectively.

In the depicted embodiment, Conflict identification program 108 utilizes network 102 to access the computing device 104 and to communicate with database 110. In one embodiment, Conflict identification program 108 resides on computing device 104. In other embodiments, Conflict identification program 108 may be located on another server or computing device, provided Conflict identification program 108 has access to database 110.

Database 110 may be a repository that may be written to and/or read by Conflict identification program 108. Information gathered from computing device 104 and the 1-dimensional, 2-dimensional, and 3-dimensional drawings and models as well as the requirements so that the materials and members are identified as conflicting or non-conflicting. In one embodiment, database 110 is a database management system (DBMS) used to allow the definition, creation, querying, update, and administration of a database(s). In the depicted embodiment, database 110 resides on computing device 104. In other embodiments, database 110 resides on another server, or another computing device, provided that database 110 is accessible to Conflict identification program 108.

Figure 2:
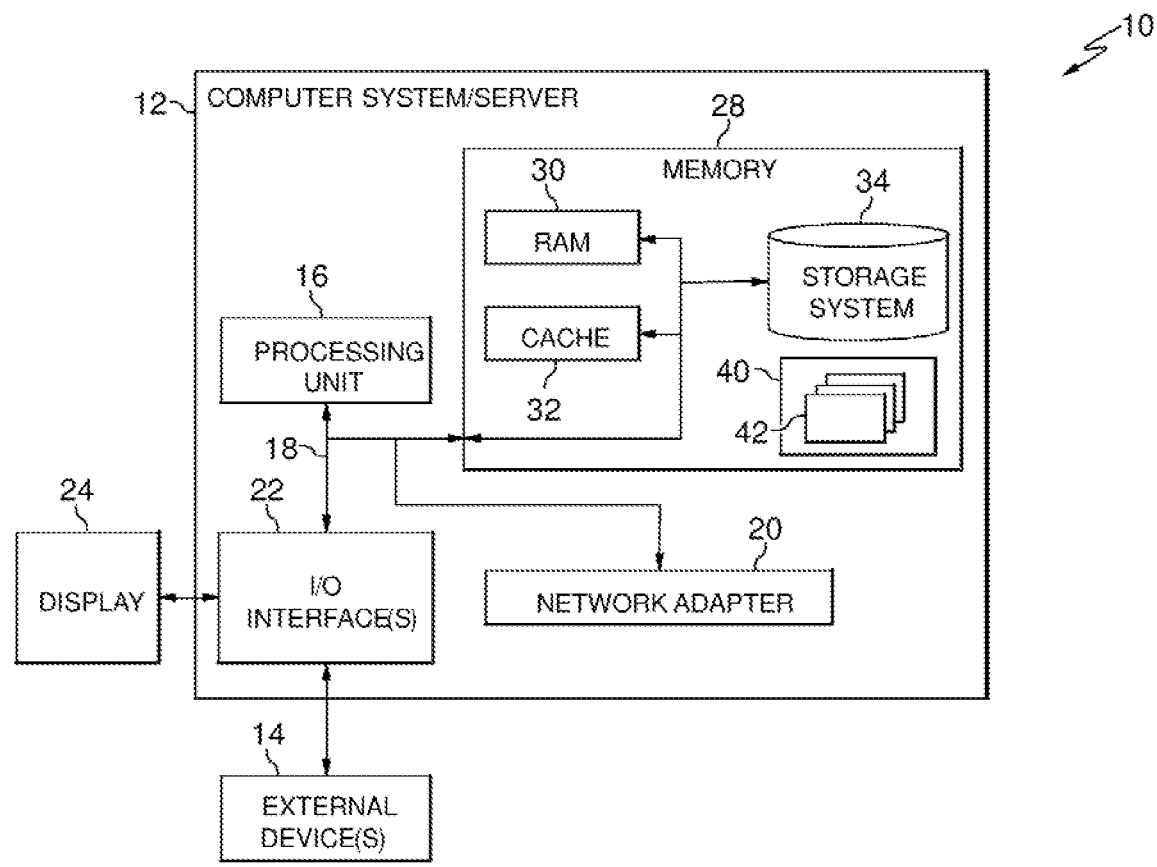
FIG. 2 depicts a block diagram depicting the internal and external components of the server and computing device of FIG. 1, in accordance with one embodiment of the present.

FIG. 2, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

FIG. 2, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a nonremovable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 3:
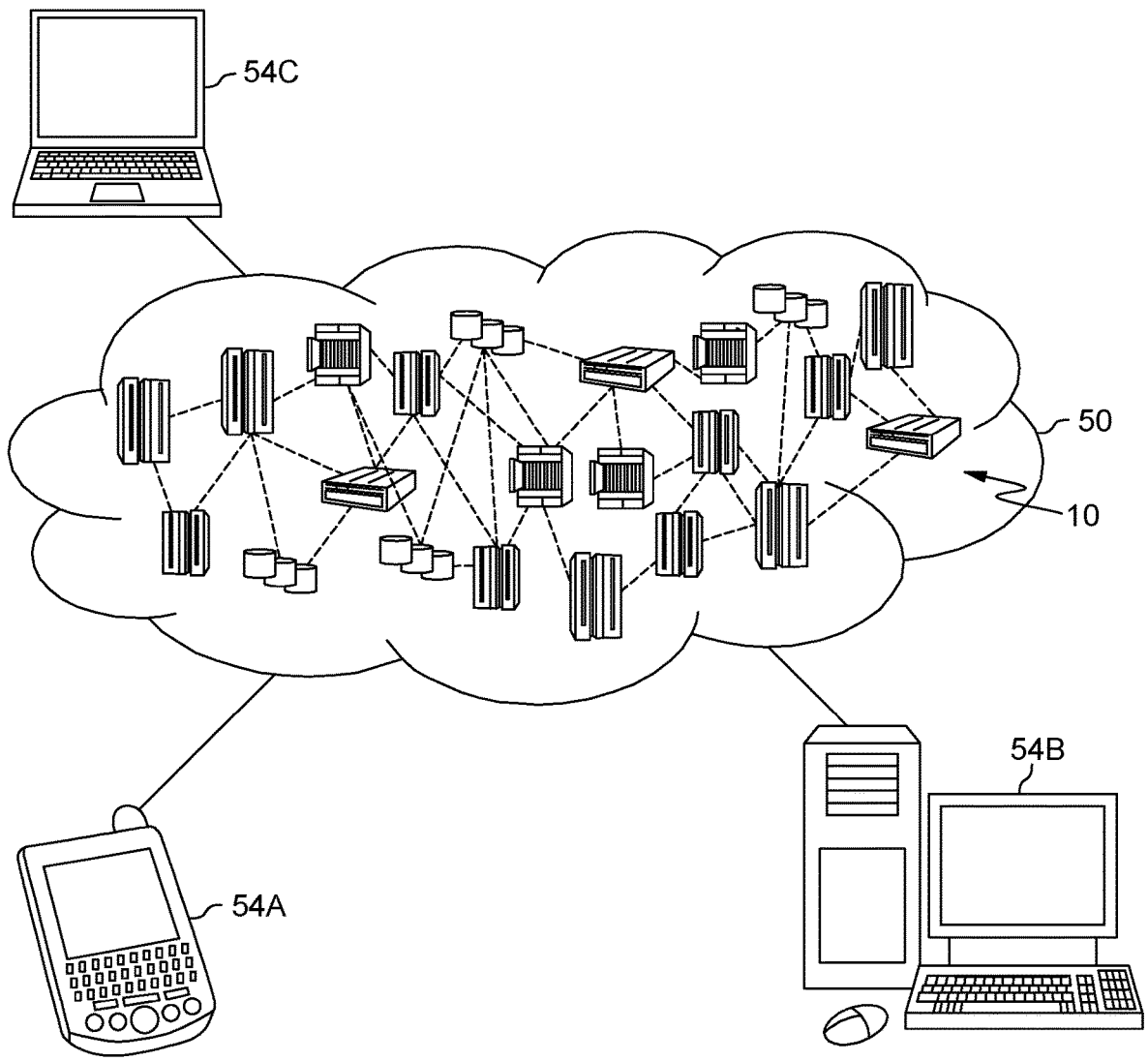
FIG. 3 depicts a cloud computing environment, in accordance with one embodiment of the present invention.

FIG. 3, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or additional computer systems may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-C shown in FIG. 2 are intended to be illustrative only and that computing nodes 10 and cloud computing environment 50 can communicate with any type of computerized device over any type of network and/or network addressable connection (e.g., using a web browser).

Referring back to FIG. 2, the Program/utility 40 may include one or more program modules 42 that generally carry out the functions and/or methodologies of embodiments of the invention as described herein.

Figure 4A:
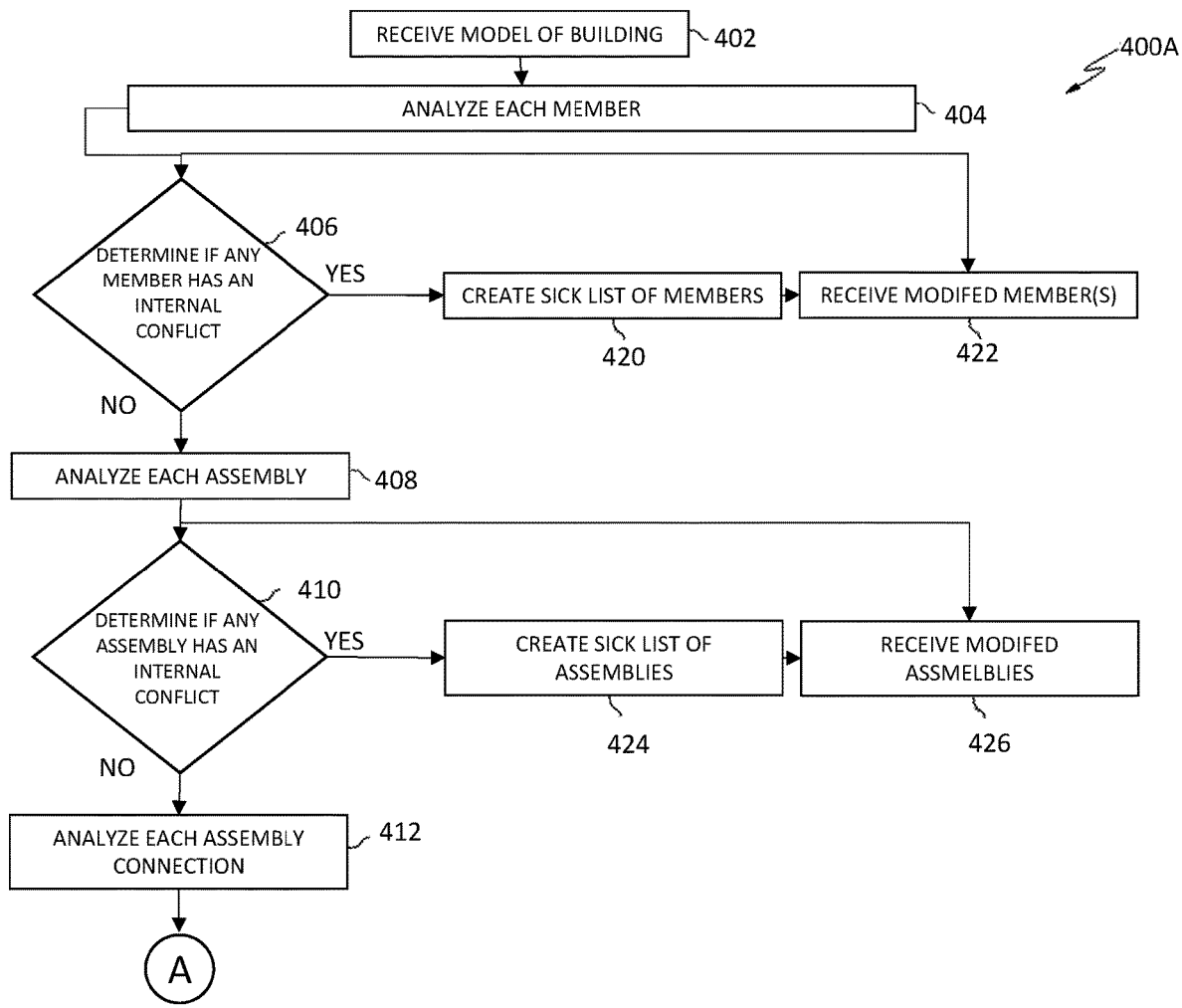
FIG. 4 depicts a flowchart of the operational steps of a method for determining conflicts between different systems of a building construction within the computing environment of FIG. 1, in accordance with one embodiment of the present invention.

FIG. 4A depicts flowchart 400A depicting a method according to the present invention. The method(s) and associated process(es) are now discussed, over the course of the following paragraphs, in accordance with one embodiment of the present invention.

The program(s) described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The program 110 is used to analyze the models or drawings to determine if and where a conflict between members is occurring and identifying the conflict and all members involved. Through the identification a list can be generated to allow a correction to be made to the member, the assembly, or the entire system to correct the error.

In step 402, the conflict identification program 108 receives a model of the building. The mode may be a 3D model of the building, may a 2D model of the building, may be a set of drawings. The model may have each any every independent element individually created. The type of model or drawings which are received dictate which of the follow steps can be completed. FIGS. 5-23 show various drawings and models of different members, assemblies, sub assemblies, systems, and complete builds of the building. The wall are placed vertically to form a barrier between internal and external space. The doors and windows provide a means for egress into and from the building. The walls, trusses, floors, plumbing, electrical and other mechanical systems and components are shown in various drawings. In the 3D model, each member and assembly has a position which is used for reference to determine if an conflict is occuring. In the depicted figures, the Detailing and Engineering of the Cold Formed Steel building is created, showing the 3-Dimensional Cold Formed Steel model. Cold formed steel model shows the building components like Cold formed steel walls, Cold Formed Steel Roof Trusses, Cold Formed Steel Floor Trusses are all models and connected to form the final building model.

In step 404, the conflict identification program 108 analyzes each member. By analyzing each member of the building, the program is able to determine if any of the members have internal conflicts. This can be, that the member is of improper measurements, material, features, or the like which would make the member have an internal conflict and not be possible to be created. If the member has negative or unrealistic values.

In one embodiment, the building is comprised of members formed from cold rolling, which are manufactured from a roll forming machine. For each Cold formed steel wall panel, the elements are screwed together to form each of the wall and floor assemblies. The program analyzes each member for various features. Such as the required Length of each cold formed steel element is determined as per the drawings. Actual length of each cold formed steel element is determined from the 3-Dimensional Cold formed steel model. DELTA which is the difference between the Required information and Actual Information is calculated. Required Orientation of each Cold formed steel element is determined as per the standard Cold formed steel Construction procedure. Actual Orientation of each cold formed steel element is determined from the 3-Dimensional Cold formed steel model. DELTA which is the difference between the Required information and Actual Information is calculated. Required Rotation of each Cold formed steel element is determined as per the standard Cold formed steel Construction procedure. Actual Rotation of each cold formed steel element is determined from the 3-Dimensional Cold formed steel model. DELTA which is the difference between the Required information and Actual Information is calculated. Member Overlapping for each Cold formed steel element is checked. Member Overlapping mean one cold formed steel element is overlapping over another member is not Desired. Actual Overlapping of each cold formed steel element is determined from the 3-Dimensional Cold formed steel model. DELTA which is the difference between the Required information and Actual Information is calculated. Member Lip Cut for each Cold formed steel element is checked. Member Lip Cut is the standard tool operation in cold formed steel. Required Lip Cut is determined by the location of another cold formed steel element connecting. The Actual Lip Cut of each cold formed steel element is determined from the 3-Dimensional Cold formed steel model. DELTA which is the difference between the Required information and Actual Information is calculated. Member Web Cut for each Cold formed steel element is checked. Member Web Cut is the standard tool operation in cold formed steel. Required Web Cut is determined by the location of another cold formed steel element passing thru. The Actual Web Cut of each cold formed steel element is determined from the 3-Dimensional Cold formed steel model. DELTA which is the difference between the Required information and Actual Information is calculated. Member Swedge for each Cold formed steel element is checked. Member Swedge is the standard tool operation in cold formed steel. Required Swedge is determined by the location of another cold formed steel element connecting. Actual swedge of each cold formed steel element is determined from the 3-Dimensional Cold formed steel model. DELTA which is the difference between the Required information and Actual Information is calculated. Member Service Hole for each Cold formed steel element is checked. Member Service Hole is the standard tool operation in cold formed steel. Required Service Hole is determined by Location of the services like Electrical, Plumbing or any other services passing thru. Actual Service Hole of each cold formed steel element is determined from the 3-Dimensional Cold formed steel model. DELTA which is the difference between the Required information and Actual Information is calculated.

In decision 406 the conflict identification program 108 determines if any of the members have any internal conflicts. If the program 108 determines that a member has an internal conflict (YES), the program 108 creates a sick list of all members which have the internal conflict (Proceed to step 420). If the program 108 does not determine that any members have an internal conflict (NO), the program 108 analyzes each assembly to determine if the assembly has a conflict (Proceed to step 408). Through the processing of each member, the program 108 is able to determine if each and every component complies with the required restraints and restrictions applied by the software. This confirms that if any conflicts are to arise, they will be not be with any of the members but with the assemblies.

In one embodiment, a conflict maybe, for example, if the Required length and Actual length is same, it means there is no Conflict. If the Required length and Actual length is not same, then there is a Conflict. The cold formed steel element which has conflict is added in SICK List. If the Required Orientation and Actual Orientation is same, it means there is no Conflict. If the Required Orientation and Actual Orientation is not same, then there is a Conflict. If the Required Rotation and Actual Rotation is same, it means there is no Conflict. If the Required Rotation and Actual Rotation is not same, then there is a Conflict. If the Required Overlapping and Actual Overlapping is same, it means there is no Conflict. If the Required Overlapping and Actual Overlapping is not same, then there is a Conflict. If the Required Lip Cut Location and Actual Lip Location Cut is same, it means there is no Conflict. If the Required Lip Cut location and Actual Lip Cut Location is not same, then there is a Conflict. If the Required Web Cut Location and Actual Web Cut Location is same, it means there is no Conflict. If the Required Web Cut location and Actual Web Cut Location is not same, then there is a Conflict. If the Required Swedge Location and Actual Swedge Location is same, it means there is no Conflict. If the Required Swedge location and Actual Swedge Location is not same, then there is a Conflict. If the Required Service Hole Location and Actual Service Hole Location is same, it means there is no Conflict. If the Required Service Hole location and Actual Service Hole Location is not same, then there is a Conflict.

In some embodiments, the member which is added to the sick list is highlighted in red in the parts list, drawings, 3D model, 2D model, or other places where the member is present.

In Step 408, conflict identification program 108 analyzes each assembly for any internal conflicts. For each assembly, a series of members are connected and secured together to create the assembly. In the formation of the assembly, each member has certain requirements to successfully build the assembly. The program 108, analyzes how each member connects or is connected to each other member to form the assembly.

In some embodiments, the program 108 analyzes for Dimple Locations of each Cold formed steel element is determined as per the Global coordinates of the connected members. Actual Dimple Locations of each cold formed steel element is determined from the 3-Dimensional Cold formed steel model. DELTA which is the difference between the Required information and Actual Information is calculated. Required Overlap Length of each Cold formed steel element is determined as per the No. of connectors required at the junction. Actual Overlap length of each cold formed steel element is determined from the 3-Dimensional Cold formed steel model. DELTA which is the difference between the Required information and Actual Information is calculated. Required Overlap Width of each Cold formed steel element is determined as per the No. of connectors required at the junction. Actual Overlap width of each cold formed steel element is determined from the 3-Dimensional Cold formed steel model. DELTA which is the difference between the Required information and Actual Information is calculated. Required Overlap Area of each Cold formed steel element is determined as per the No. of connectors required at the junction. Actual Overlap Area of each cold formed steel element is determined from the 3-Dimensional Cold formed steel model. DELTA which is the difference between the Required information and Actual Information is calculated.

In Decision 410, conflict identification program 108 determines if any of the assemblies have internal conflicts. The internal conflicts hinder the assemblies ability to be constructed and may include conflicts between the members lacking features to construct the assembly or may be unable to connect with the other members. If the program 108 determines that the assembly as internal conflicts between members (YES), the program 108 creates a sick list of the assembly and the members of the assembly that are causing the conflicts. If the program 108 determines that the assembly does not have any internal conflicts (No), the program 108 analyzes the connect between each assembly (Proceed to step 412).

For example, if the program determines that the Required Dimple location and Actual Dimple Location is same, it means there is no Conflict. If the Required Dimple Location and Actual Dimple Location is not same, then there is a Conflict. If the Required Overlap length and Actual overlap length is same, it means there is no Conflict. If the Required Overlap length and Actual Overlap length is not same, then there is a Conflict. If the Required Overlap width and Actual overlap length is same, it means there is no Conflict. If the Required Overlap width and Actual Overlap width is not same, then there is a Conflict. If the Required Overlap Area and Actual overlap Area is same, it means there is no Conflict. If the Required Overlap Area and Actual Overlap Area is not same, then there is a Conflict.

In some embodiments, the assembly and or the members which have conflicts are added in the SICK List and the assembly or member is Highlighted, and the member is identified in an alternative color in the drawings or models from the members and assemblies which do not have any conflicts.

In Step 412, conflict identification program 108 analyzes each assembly connect with other assemblies or members for any external conflicts. Each assembly is connected to other assemblies or members to form the building. This may include multiple assemblies for walls, floors, framing, roofing, trusses, and other building features, that are necessary to successfully construct the building. Each assembly needed to be properly connected with the other assemblies.

For example, the program 108 may analyze the required Maximum Tolerance of each Cold formed steel panels is determined as per the standard Construction Tolerances. Actual Tolerance of each cold formed steel panels is determined from the 3-Dimensional Cold formed steel model. DELTA which is the difference between the Required information and Actual Information is calculated. Required Minimum Tolerance of each Cold formed steel panel is determined as per the standard Construction Tolerances. Actual Tolerance of each cold formed steel Roof panel is determined from the 3-Dimensional Cold formed steel model. DELTA which is the difference between the Required information and Actual Information is calculated. Required Maximum Tolerance of each Cold formed steel panels is determined as per the standard Construction Tolerances. Actual Tolerance of each cold formed steel panels is determined from the 3-Dimensional Cold formed steel model. DELTA which is the difference between the Required information and Actual Information is calculated. Required Minimum Tolerance of each Cold formed steel panels is determined as per the standard Construction Tolerances. Actual Tolerance of each cold formed steel panels is determined from the 3-Dimensional Cold formed steel model. DELTA which is the difference between the Required information and Actual Information is calculated. Required Bearing Area of each Cold formed steel panels is determined as per the standard Construction method. If the Roof Truss or Floor Truss us resting completing on the Wall then the Required Bearing area is total overlap area. Actual Bearing area of each cold formed steel panels is determined from the 3-Dimensional Cold formed steel model. DELTA which is the difference between the Required information and Actual Information is calculated.

In Decision 414, conflict identification program 108 determines if any of the assemblies have external conflicts with mating assemblies or members. The external conflicts do not allow the assemblies and individual members to properly mate, and thereby results in a unsafe building be being constructed. If the program 108 determines that the assembly has mating conflicts with properly situated assemblies (YES), the program 108 creates a sick list of the assembly and the members of the assembly that are causing the conflicts. If the program 108 determines that the assembly does not have any external mating issues (No), the program 108 analyzes the entire assembly and sub-systems (Proceed to step 412).

For example, if the program 108 determines the Required Maximum tolerance and Actual maximum Tolerance is same, it means there is no Conflict. If the Required Maximum tolerance and Actual Maximum tolerance is not same, then there is a Conflict. If the Required Minimum tolerance and Actual Minimum Tolerance is same, it means there is no Conflict. If the Required Minimum tolerance and Actual Minimum tolerance is not same, then there is a Conflict. If the Required Maximum tolerance and Actual maximum Tolerance is same, it means there is no Conflict. If the Required Maximum tolerance and Actual Maximum tolerance is not same, then there is a Conflict. If the Required Minimum tolerance and Actual Minimum Tolerance is same, it means there is no Conflict. If the Required Minimum tolerance and Actual Minimum tolerance is not same, then there is a Conflict. If the Required Bearing area and Actual bearing area is same, it means there is no Conflict. If the Required bearing area and Actual bearing area is not same, then there is a Conflict.

In some embodiments, the assembly and or the members which have conflicts are added in the SICK List and the assembly or member is Highlighted, and the member is identified in an alternative color in the drawings or models from the members and assemblies which do not have any conflicts.

In Step 416, the conflict identification program 108, analyzes each sub-system within the building assembly. Once it is determined that the structure (walls, roof, flooring, etc.) has no conflicts, the program 108 analyzes the sub-systems to determine if there are any conflicts relative to the building structure and the sub-systems. The sub-systems may include, but not limited to HVAC, plumbing, electrical, and the like that is standard or common with the construction of new buildings. These sub-systems may shift and adjust based on location, and new technologies that are implemented and identified in the software used to create the 3D models.

For example, Member Overlapping for each Cold formed steel element is checked. Member Overlapping mean one cold formed steel element is overlapping over another Architectural member is not Desired. Actual Overlapping of each cold formed steel element is determined from the 3-Dimensional Cold formed steel model. DELTA which is the difference between the Required information and Actual Information is calculated. Overlapping may include the inability for HVAC conduit to be run through the wall, ceiling, or floor properly. Water or gas lines do not have proper cutouts to be run from a first floor to a second floor. The ceiling is not an approved height because the HVAC conduit was not taken into account when building the height of the room. The Cold formed steel members do not have the proper openings or cutouts to run electrical wires through the walls. A window or door is placed in a position that creates a conflict with the electrical or plumbing sub-systems. The sub-systems may be incorporated into the 3D model when being built, or may be added in later by the software or a third party software. The program 108 may have an understanding of construction codes to determine proper spacing, location, and the like of the various sub-system components.

In Decision 418, conflict identification program 108 determines if the entire assembly (including the sub-systems) have any conflicts. With the sub-systems incorporated into the model of the building, the program 108 determines if there are any new conflicts that would hinder or halt the installation of the sub-systems. If the program 108 determines that the assembly has mating conflicts with properly situated assemblies (YES), the program 108 creates a sick list of the assembly and/or the members of the assembly that are causing the conflicts as well as which sub-system is involved in the conflict. If the program 108 determines that the assembly does not have any conflicts with the sub-systems (No), the program 108 identifies the model as being free of conflicts and ready for construction (Proceed to step 419).

For example, if the program 108 determines that the required overlapping and Actual Overlapping is same, it means there is no Conflict. If the Required Overlapping and Actual Overlapping is not same, then there is a Conflict. If the program 108, determines that the required cutouts or openings are not present, there is a conflict.

In some embodiments, the assembly and/or the member(s) and the sub-systems which have conflicts are added in the SICK List and the assembly or member is Highlighted, and the member is identified in an alternative color in the drawings or models from the members and assemblies which do not have any conflicts.

In Step 420, the conflict identification program 108, creates the sick list for the members. The sick list identifies each and every member that has a conflict associated with. The list may include a physical list of the parts, identification of the members in the models or drawings or other means to identify to the user the members with the conflicts.

In Step 422, the conflict identification program 108, receives a modified member or an input which affects the member in an attempt to over come the conflict. The input or command may be manually entered by a user. In some embodiments, the input is automatically input by the program 108 through computer learning, machine learning, or artificial intelligence that is able to analyze the member, determine the correct or a correct modification, and automatically process the amendment.

In Step 424, the conflict identification program 108, creates the sick list for the assemblies. The sick list identifies each and every member and assembly that has a conflict associated with. The list may include a physical list of the parts, identification of the assemblies or the members in the models or drawings or other means to identify to the user the members with the conflicts.

In Step 426, the conflict identification program 108, receives a modified member or an input which affects the member in an attempt to over come the conflict. The input or command may be manually entered by a user. In some embodiments, the input is automatically input by the program 108 through computer learning, machine learning, or artificial intelligence that is able to analyze the member, determine the correct or a correct modification, and automatically process the amendment.

In Step 428, the conflict identification program 108, creates the sick list for the assemblies and the members within the assemblies with the conflicts. The sick list identifies each and every member that has a conflict associated with and the assemblies which the member is a part of The list may include a physical list of the parts, identification of the members and assemblies in the models or drawings or other means to identify to the user the members and assemblies with the conflicts.

In Step 430, the conflict identification program 108, receives a modified member or an input which affects the member in an attempt to over come the conflict. The input or command may be manually entered by a user. In some embodiments, the input is automatically input by the program 108 through computer learning, machine learning, or artificial intelligence that is able to analyze the member, determine the correct or a correct modification, and automatically process the amendment.

In Step 432, the conflict identification program 108, creates the sick list for the assemblies and the members within the assemblies with the conflicts. The sick list identifies each and every member that has a conflict associated with and the assemblies which the member is a part of The list may include a physical list of the parts, identification of the members and assemblies in the models or drawings or other means to identify to the user the members and assemblies with the conflicts.

In Step 434, the conflict identification program 108, receives a modified member or an input which affects the member in an attempt to over come the conflict. The input or command may be manually entered by a user. In some embodiments, the input is automatically input by the program 108 through computer learning, machine learning, or artificial intelligence that is able to analyze the member, determine the correct or a correct modification, and automatically process the amendment.

Figure 4B:
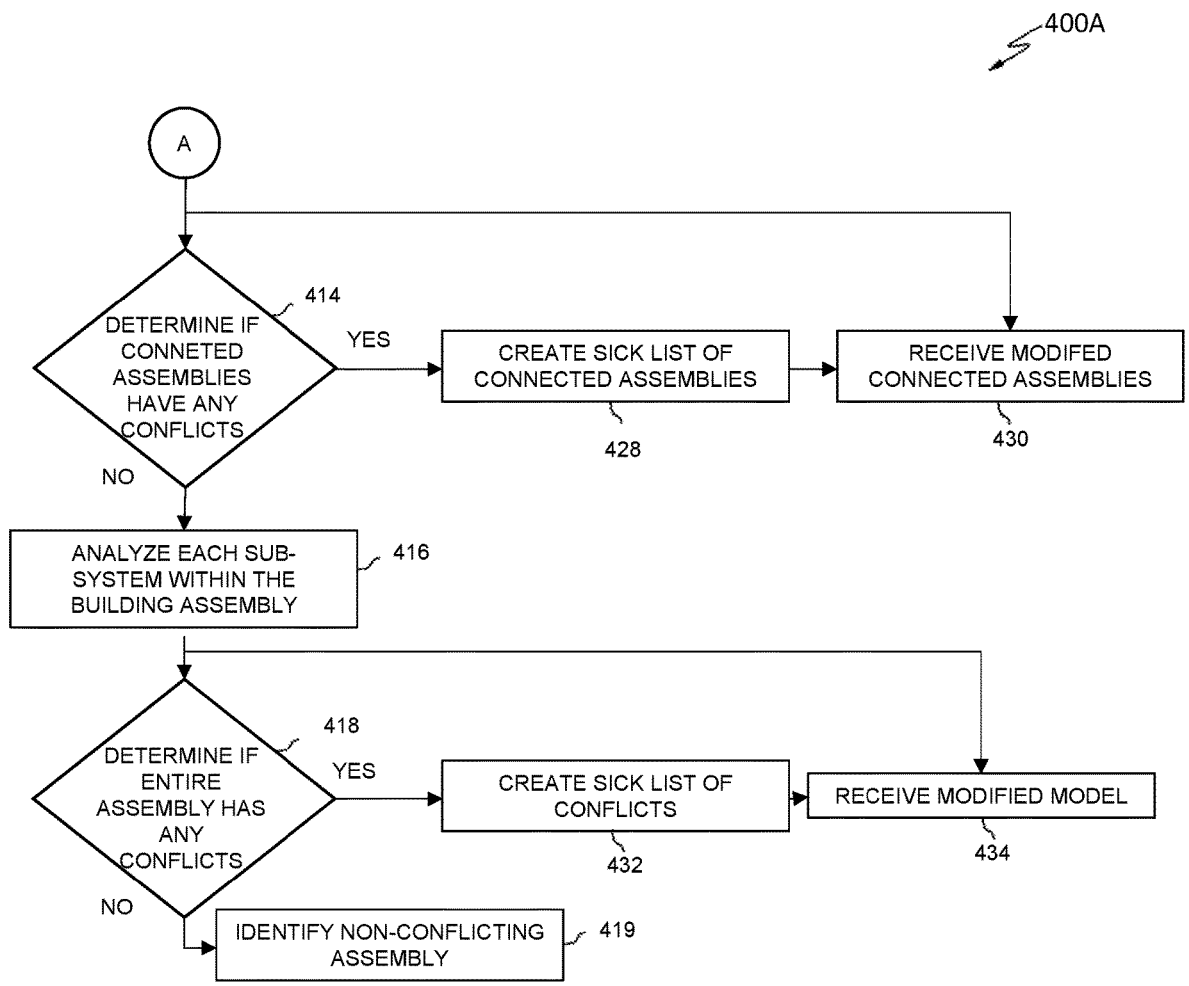
Figure 5:
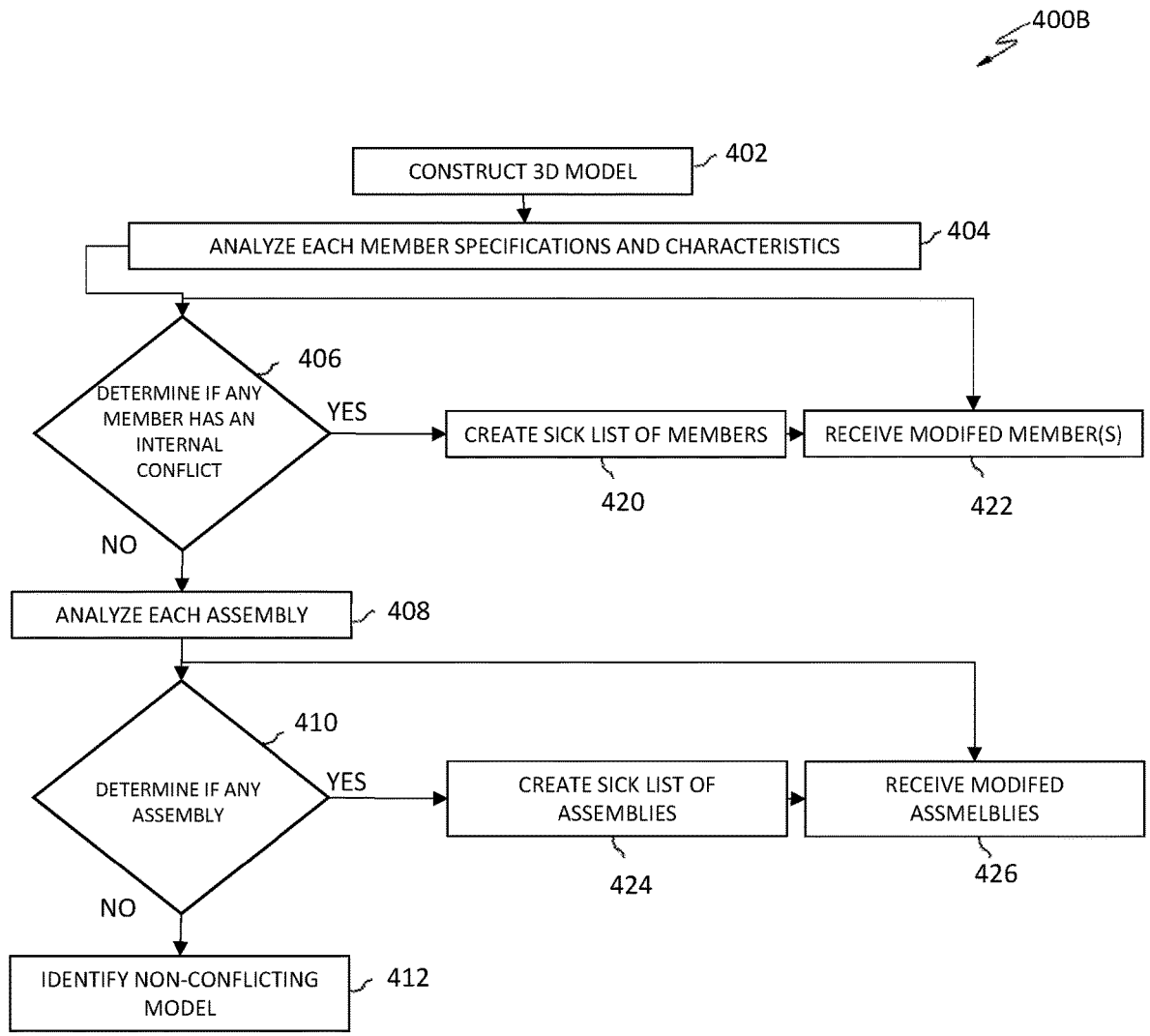
FIG. 5 depicts a flowchart of the operational steps of a method for determining conflicts between different systems of a building construction within the computing environment of FIG. 1, in accordance with another embodiment of the present invention.

FIG. 5 depicts flowchart 400B depicting a method according to the present invention. The method(s) and associated process(es) are now discussed, over the course of the following paragraphs, in accordance with one embodiment of the present invention. In this alternative embodiment, the process is simplified to check for internal conflicts with each member, and then check for external conflicts with each members interaction with the other members, assemblies, and the sub-systems. This is a similar process to FIGS. 4A-4B expect the assembly conflict searches are performed across the entire model and the sub systems substantially at the same time. This produces the same outcome, by identifying each conflict and the associated member. However requires less iterations to complete the entire model.

Figure 6:
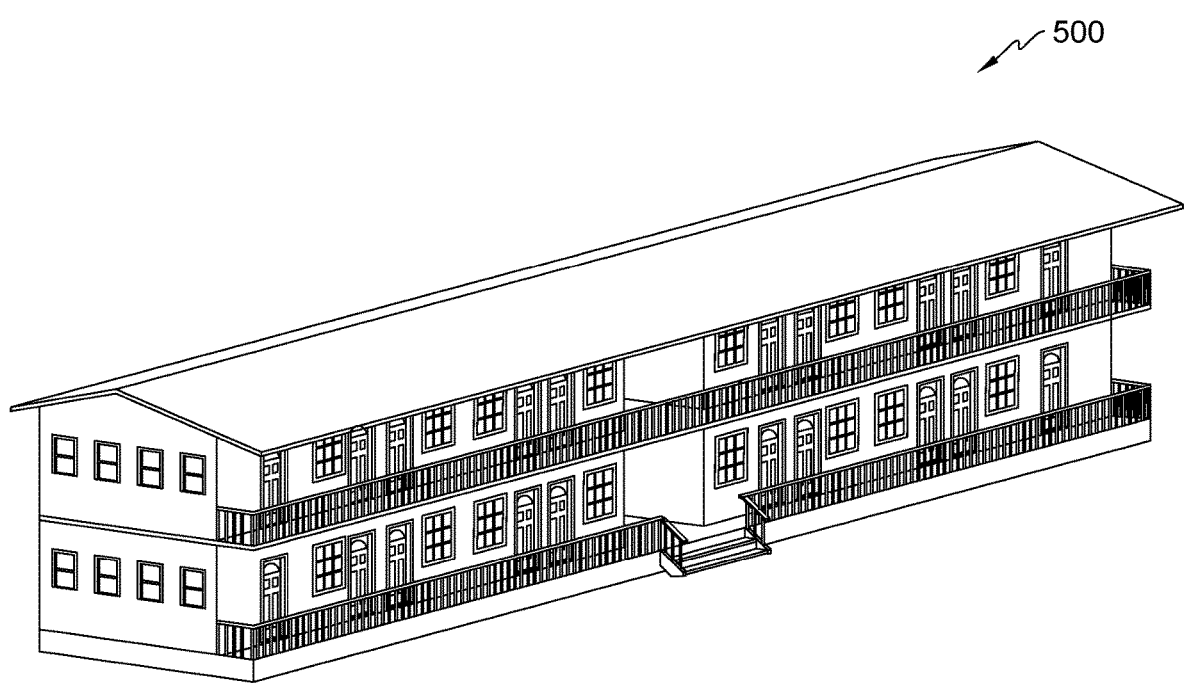
FIG. 6 depicts a 3-Dimensional Architectural model for a Building, in accordance with one embodiment of the present invention.

FIG. 6 depicts an Architectural model 600 for a building, in accordance with one embodiment of the present invention. The depicted image shows a completed 3D model of a building. This model includes (but is not shown) all structural members, electrical, pumping, HVAC, and finishing components to create the final building construction. The 3D model is designed to be able to locate the position of each member, and give coordinates of any conflicts of each member.

Figure 7A:
FIGS. 7A-B depicts a 2-Dimensional Architectural Building Elevation, in accordance with one embodiment of the present invention.
Figure 7B:
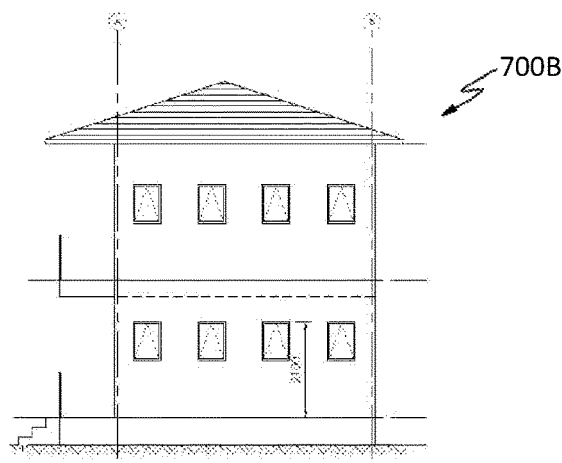

FIGS. 7A-C depict 2-Dimensional Architectural Floor Layouts 700 for a building, in accordance with one embodiment of the present invention. These 2D images depicted the floor plans of the 3D model to show walls, doors, stairs, windows, rooms, and other architectural features of each floor of the building.

Figure 8A:
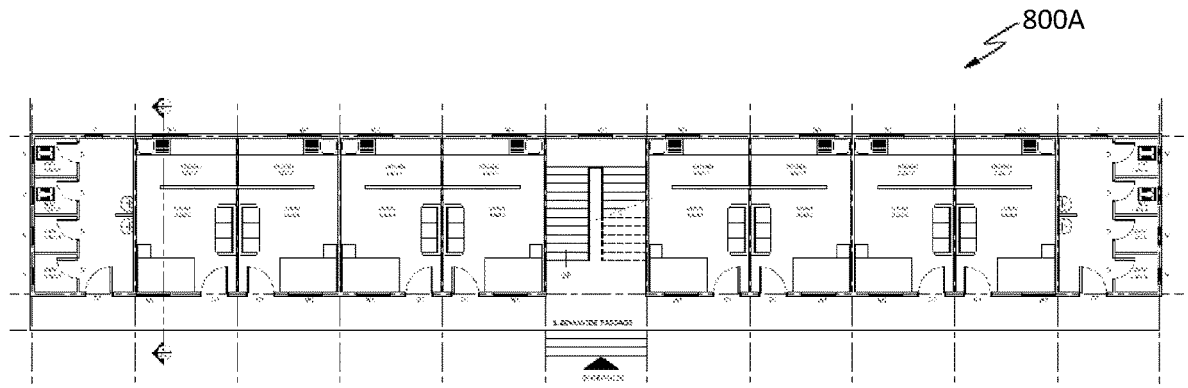
FIGS. 8A-C depicts a 2-Dimensional Architectural Floor Layouts for the Building, in accordance with one embodiment of the present invention.
Figure 8B:
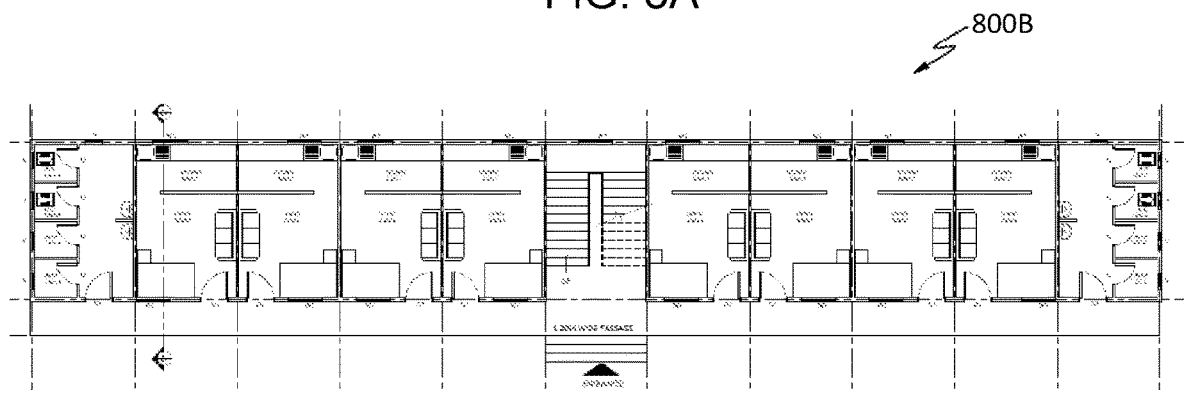
Figure 8C:
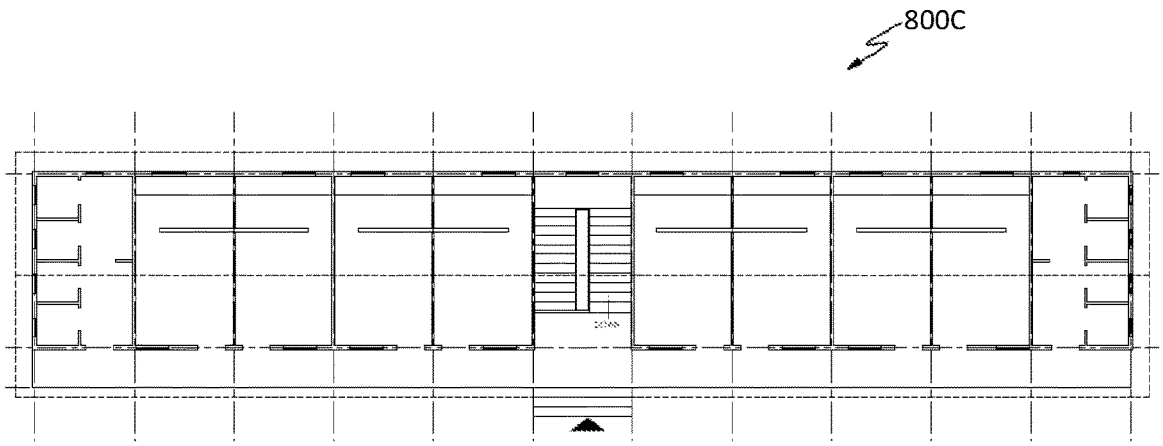

FIG. 8A-B depict 2-Dimensional Architectural Building Elevations 800, in accordance with one embodiment of the present invention. These show the front and side views of the building. These figures depict a floor plan with doors, windows, stairs, furniture, cabinets.

Figure 9:
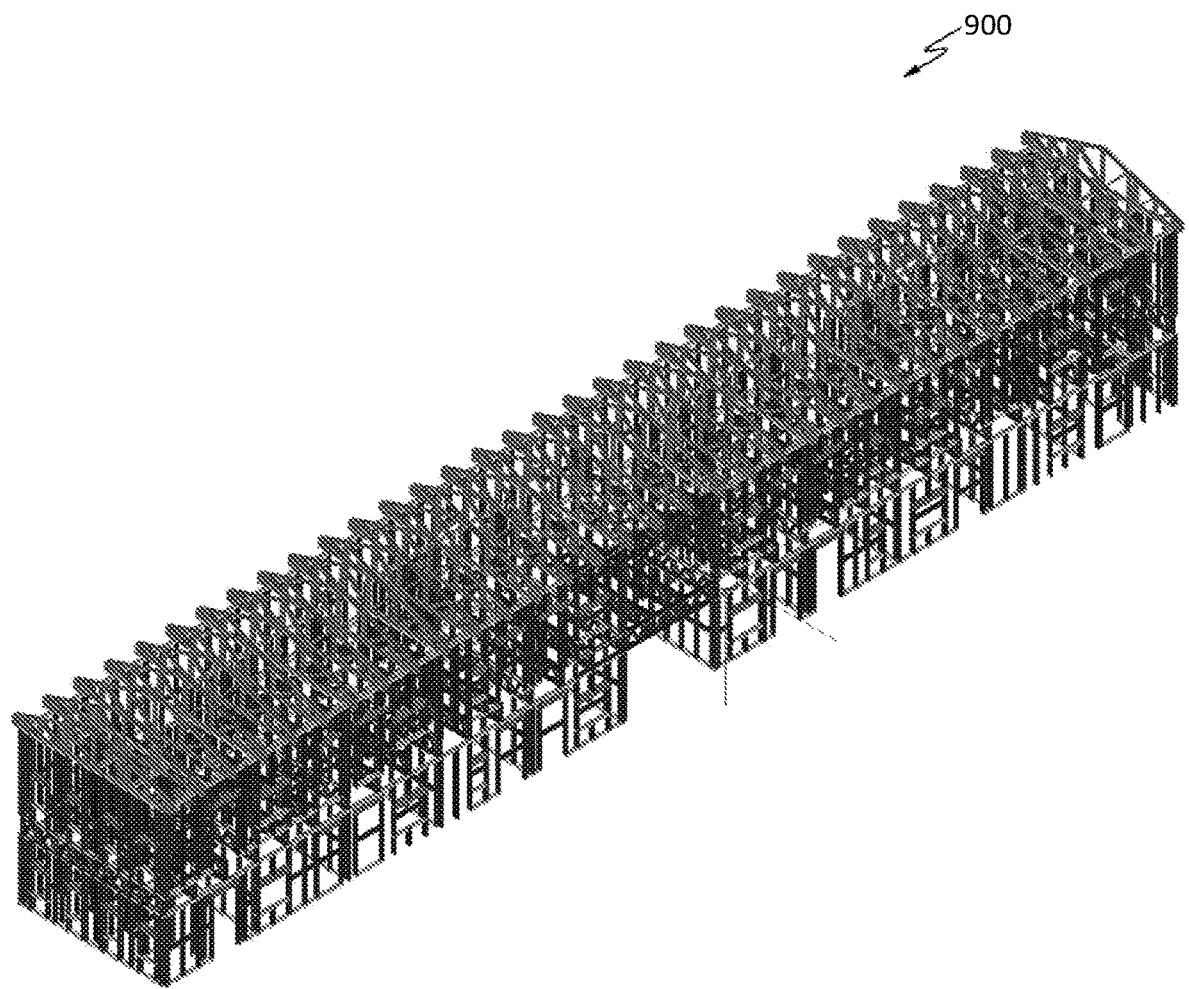
FIG. 9 depicts a 3-Dimensional Structural model for the formed steel building frame, in accordance with one embodiment of the present invention.

FIG. 9 depicts a 3-Dimensional Structural model 900 for a cold formed steel building frame, in accordance with one embodiment of the present invention. This image depicts all of the structural members, with all the connection points for the frame. This model would be analyzed for each structural member to determine any conflicts. If a conflict is found, that member may be highlighted or identified in a different color to allow easy visual identifies for the user to locate the conflict member. The image depicts the Complete 3-Dimensional Cold Formed Steel model. Cold formed steel model shows the building components like Cold formed steel walls, Cold Formed Steel Roof Trusses, Cold Formed Steel Floor Trusses. After completion of the building 3-Dimensional model in program 108 processes the conflict check.

Figure 10A:
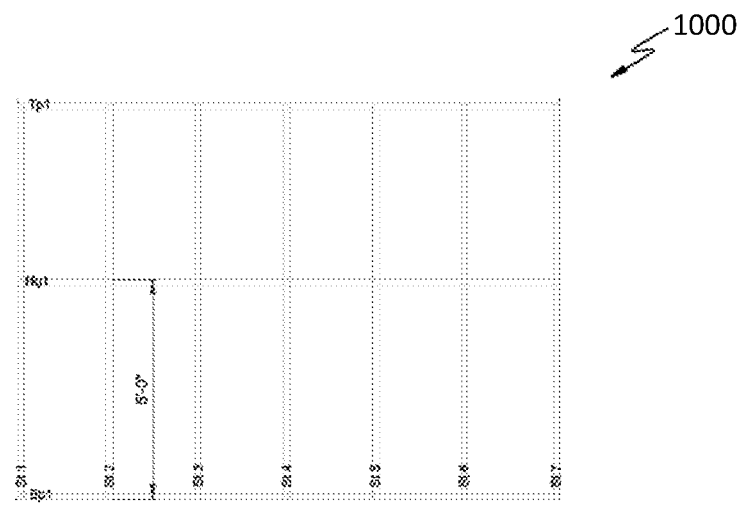
FIGS. 10A-B depicts a formed steel Wall Panel showing 1-Dimenstional elements, in accordance with one embodiment of the present invention.
Figure 10B:
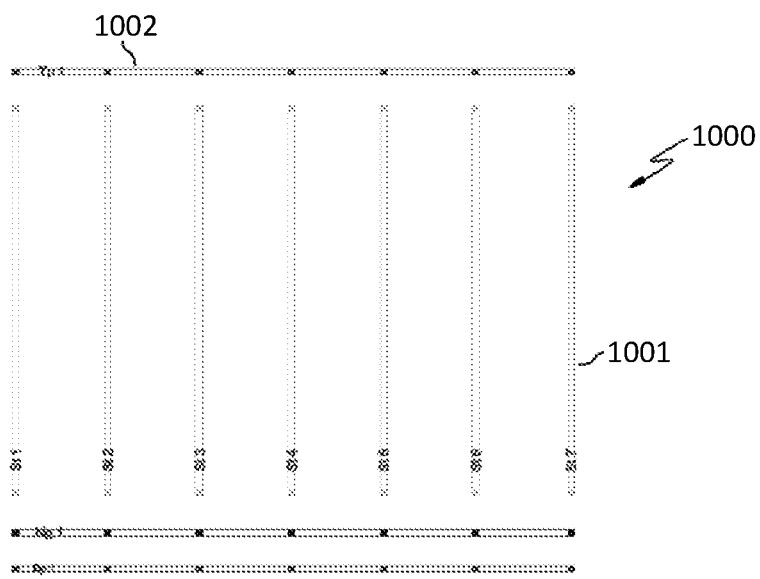
Figure 11A:
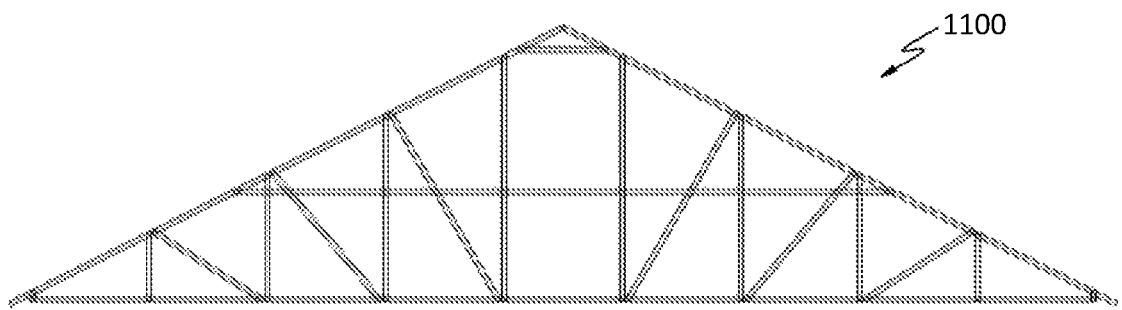
FIGS. 11A-B depicts a formed steel Roof Truss Frame showing 1-Dimenstional elements, in accordance with one embodiment of the present invention.
Figure 11B:
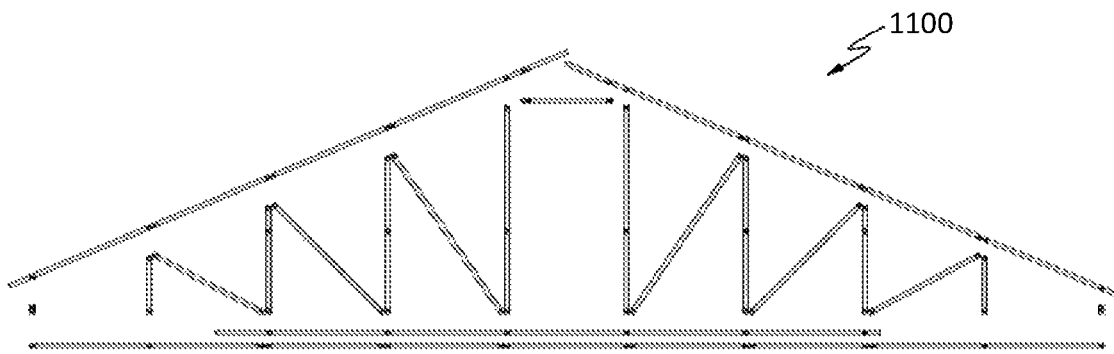
Figure 12A:
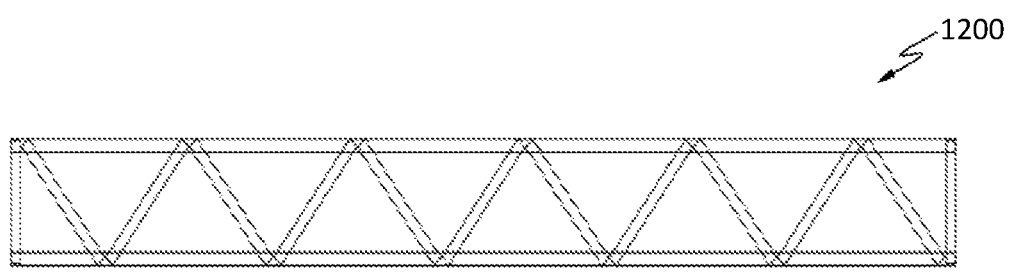
FIGS. 12A-B depicts a formed steel Floor Truss Frame showing 1-Dimenstional elements, in accordance with one embodiment of the present invention.
Figure 12B:
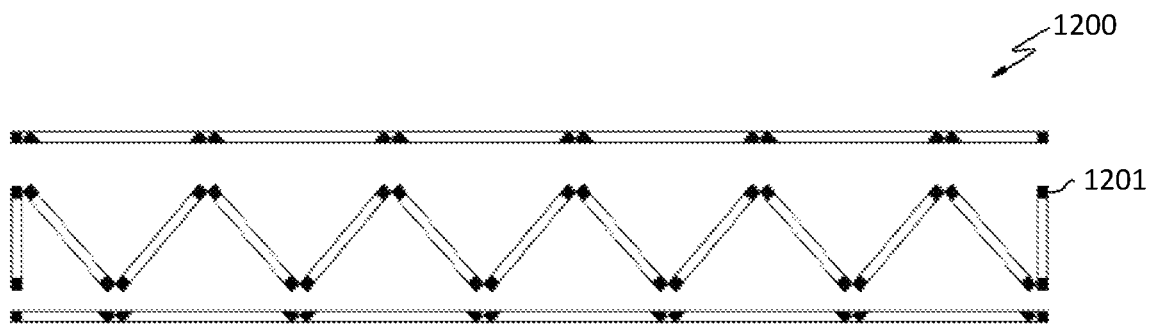

FIGS. 10, 11, and 12 depict walls 1000, trusses 1100, and floors 1200 made from cold formed steel members, in accordance with one embodiment of the present invention. The images show a wall panel, a roof truss, and a floor truss in both the assembled and disassembled states. Each assembly would be analyzed individually for any conflicting members and added to the sick list, and then analyzed for the entire assembly for any conflicts or issues and those would then be added to the sick list. In some embodiments, if a member is a conflict both individually and in an assembly it is identified different as having twice the conflicts. In FIG. 10B a wall is depicted in individual members. Member 1002 is identified in a different line thickness than member 1001. This is an example of a conflicting member may be shown. In additional embodiments, the member may be shown in a different color or visual identified to show it is a member that is on the sick list. In FIG. 12B, the individual members are shown with a portion that is a different color, for example the ends of member 1201. This delineates a cutout or altered portion of the member, so that when it is connected to another member there is no overlap or issue resulting in the member not being added to the sick list. If member 1201 did not have the cutout, when the assembly is created FIG. 12A, the members will overlap and create a conflict.

Figure 13:
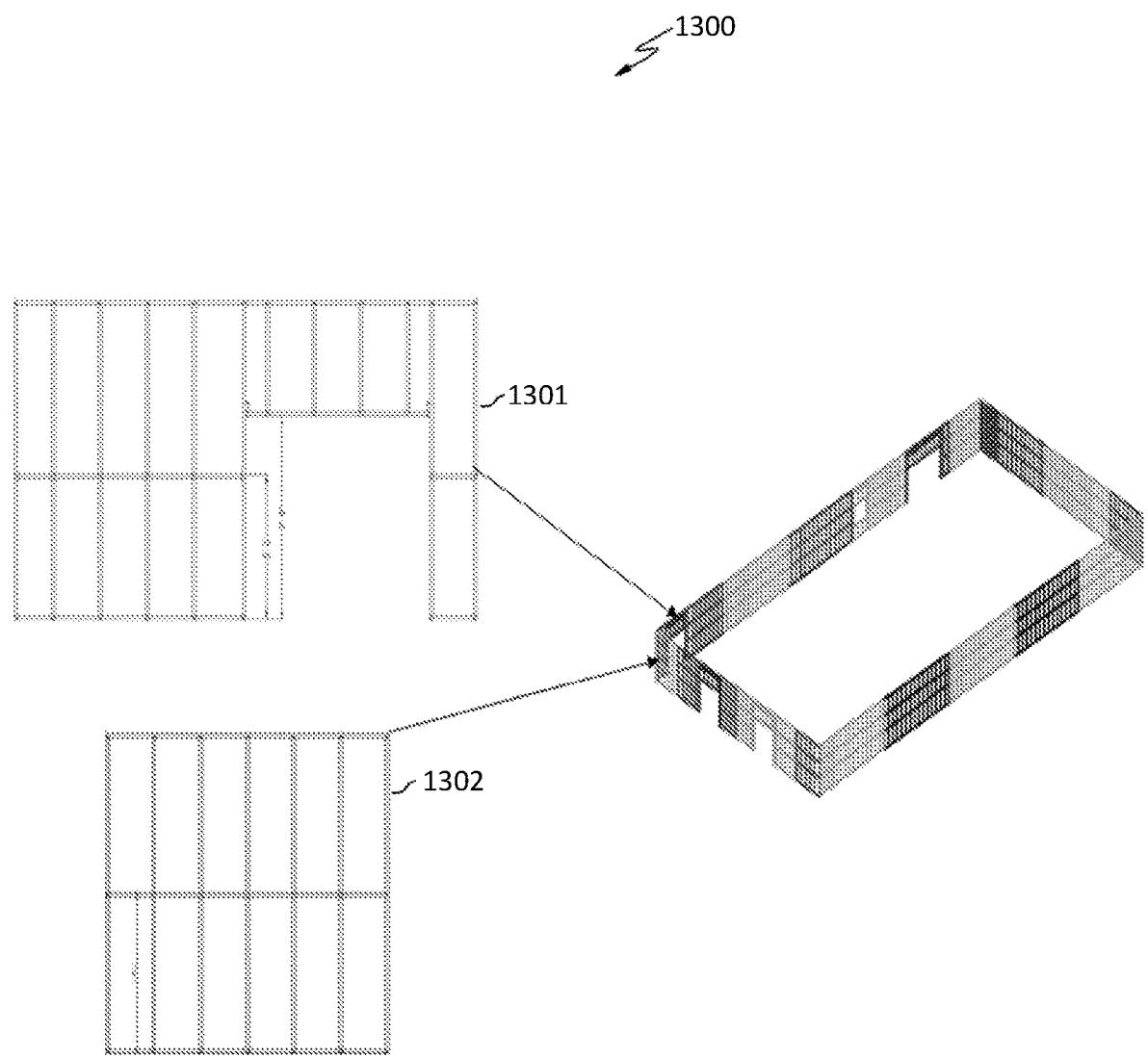
FIG. 13A-C depicts a formed 3D model of the exterior frame of a building and 1D images of various sections of the wall, in accordance with one embodiment of the present invention.

FIG. 13 depicts a formed 3D model 1300 of the exterior frame of a building and 1D images of various sections of the wall, in accordance with one embodiment of the present invention. The 3D image depicted the exterior walls of one floor or a building, wherein the wall is formed from cold formed steel members. The wall is comprised of a plurality of assemblies 1301 and 1302 which are secured together during the construction process. Each assembly may come pre assembled, or may be assembled on site. When analyzing a model of this design, first each member of each assembly is analyzed, then each assembly is analyzed, and then the complete exterior frame is analyzed to determine where, if any, conflicts exist. In some embodiments, where the exterior frame assembly is a single assembly, the program may analyze the entirety of the exterior frame, or may analyze portions one at a time. The program may be limited, in some embodiments, based on how the 3D model was built. In other embodiments, the program is able to determine how to analyze the assembly independently based on the most efficient method to identify conflicts between the members and the assembly(ies).

Figure 14A:
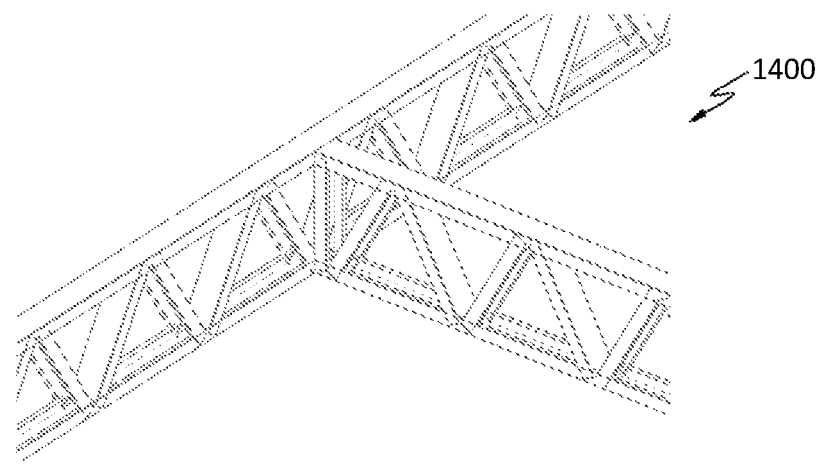
FIGS. 14A-B depicts a floor joist connected with another floor joist, and a floor joist connected to two (one above and one below) wall frames, in accordance with one embodiment of the present invention.
Figure 14B:
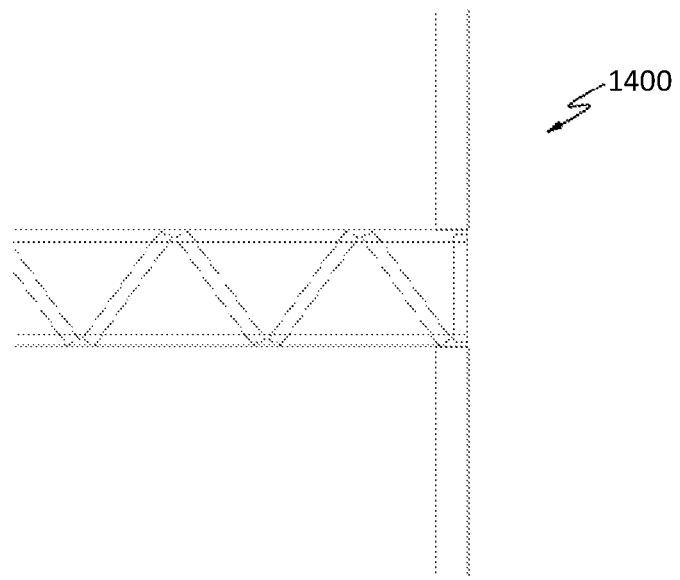
Figure 15A:
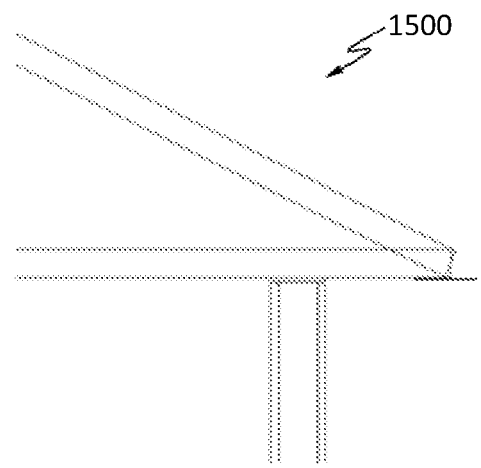
FIGS. 15A-B are roof trusses resting on wall panels, in accordance with one embodiment of the present invention.
Figure 15B:
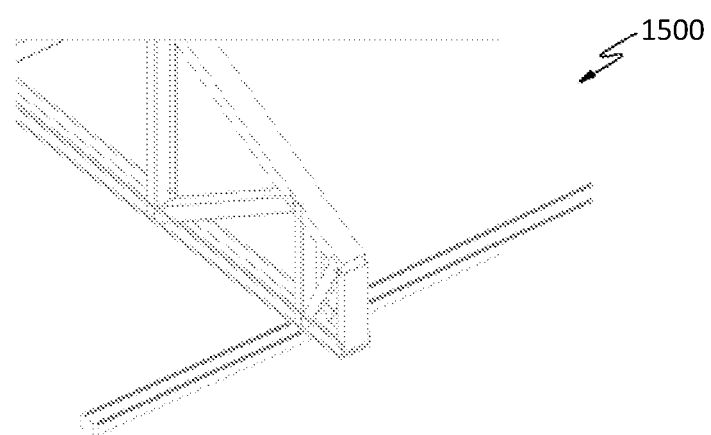

FIGS. 14A-B depicts a floor joist 1400 connected with another floor joist, and a floor joist connected to two (one above and one below) wall frames. This is a depiction of the connection of two assemblies, where the members which interact need to have the proper cutouts or openings to allow the connection of these two assemblies. FIGS. 15A-B depict roof trusses 1500 resting on wall panels. This depicts another example of two assemblies interacting, and where the program 108 analyzes the members which are interacting between assemblies to determine if the desired or required connection methods can be achieved based on the sections of the members which are interacting.

Figure 16:
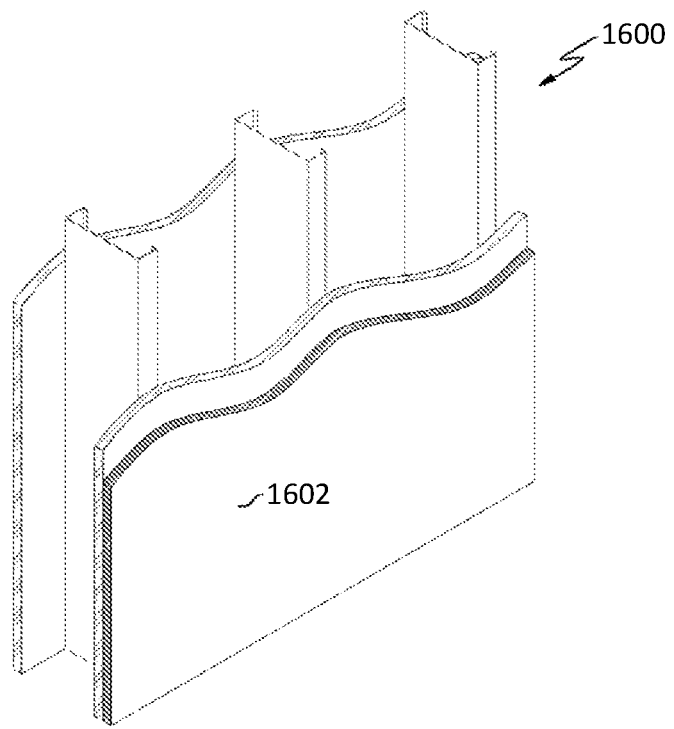
FIG. 16 depicts an architectural wall cross sectional view showing the wall sheathing layers and arrangement, in accordance with one embodiment of the present invention.

FIG. 16 depicts an architectural wall cross sectional view 1600 showing the wall sheathing layers 1602 and arrangement, in accordance with one embodiment of the present invention. The wall sheathing layers are sub-systems which are applied and are included in the calculation to make sure the framing is able to handle the weight of the sheathing layers. This may be brick, stucco, vinyl, wood, or the like which is used to construct the building. Typically building walls are finished with different sheathing material based on the use of the building, climate and many other factors.

Figure 17:
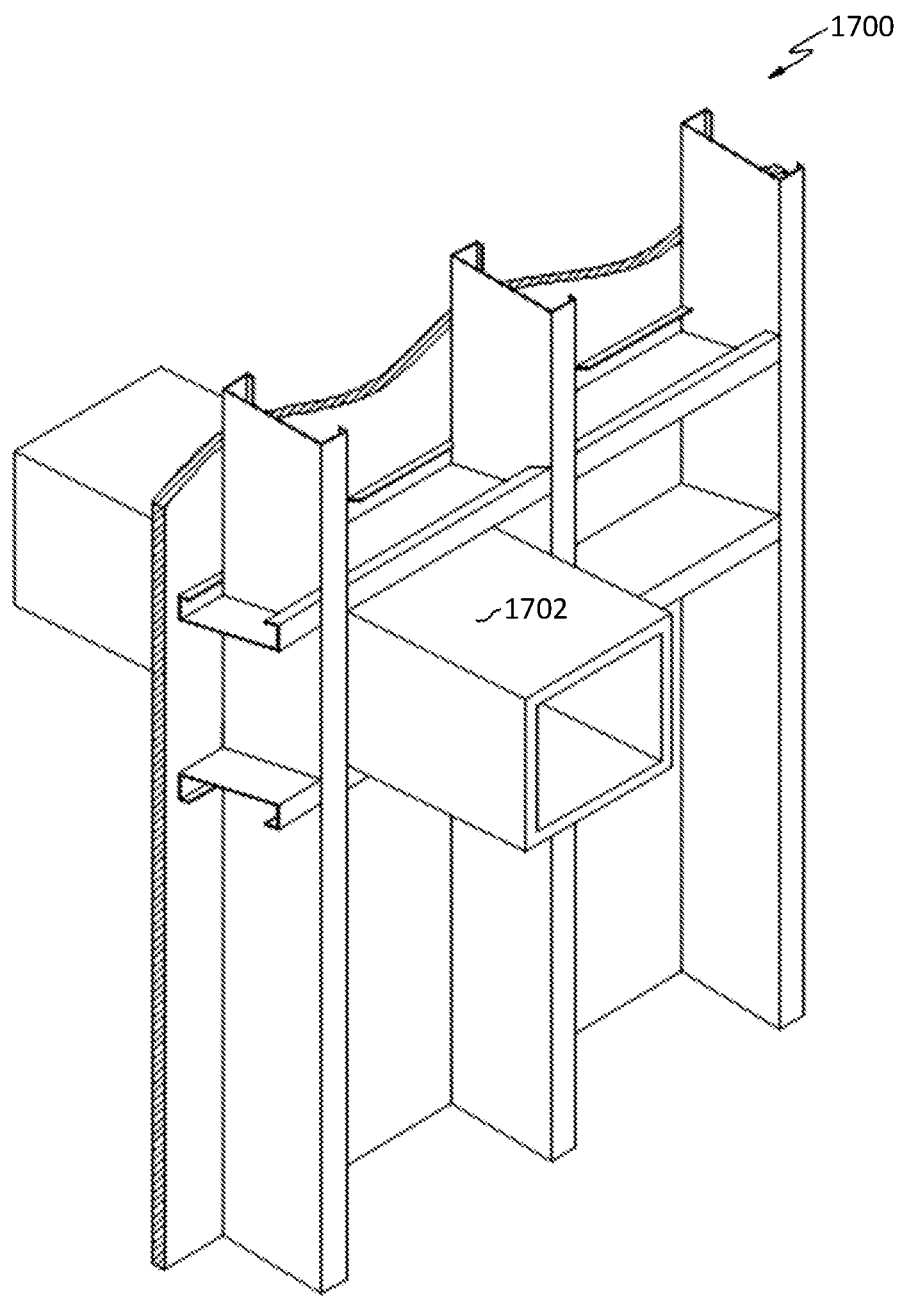
FIG. 17 depicts a Mechanical System in the building, in accordance with one embodiment of the present invention.

FIG. 17 depicts a mechanical system 1702 in the wall 1700, in accordance with one embodiment of the present invention. The mechanical system 1702, in the depicted embodiment, is a duct or HVAC duct that would be integrated into a wall, ceiling, or floor. The depiction shows how the members are spaced to provide for an adequate opening to allow the duct to pass through the wall, and also provide support with the vertical members.

Figure 18A:
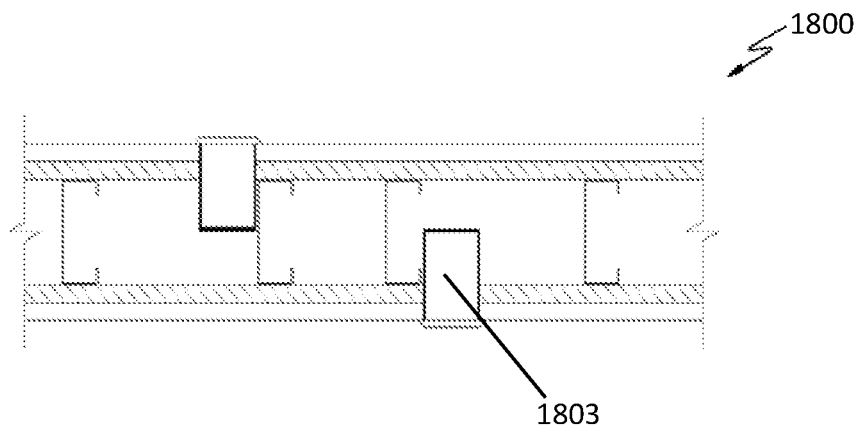
FIGS. 18A-B depicts an electrical sub system in the building, in accordance with one embodiment of the present invention.
Figure 18B:
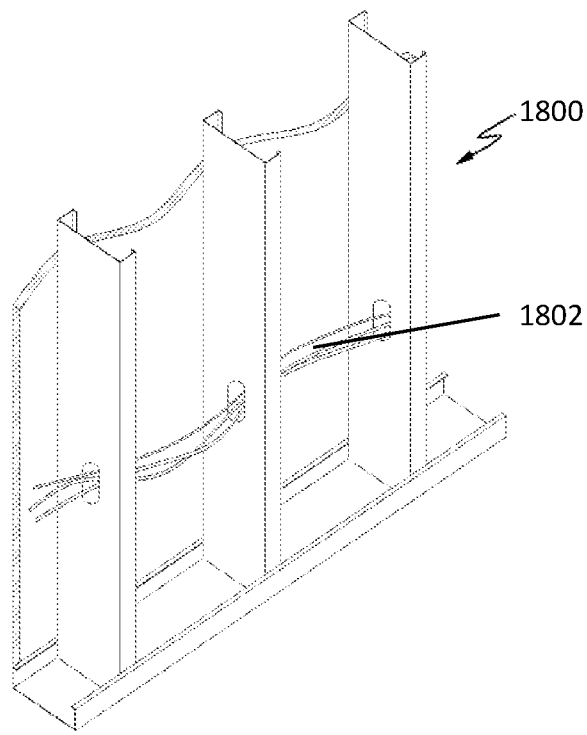

FIGS. 18A-B depicts an electrical sub system components 1802 and 1803 in the wall 1800, in accordance with one embodiment of the present invention. In the depicted embodiments, the members are cut to permit the cables 1802 to pass through the members and the members would be predrilled or taped to allow for the proper placement and connection of the junction boxes 1803. These needs to be at the desired locations, heights, and distance apart to conform with all regulations. In some embodiments, the program, based on an understanding of the regulation and codes can determine the proper height, placement, width, and the like of all the necessary modifications to the members to accommodate the desired electrical system.

Figures 19A, 19B:
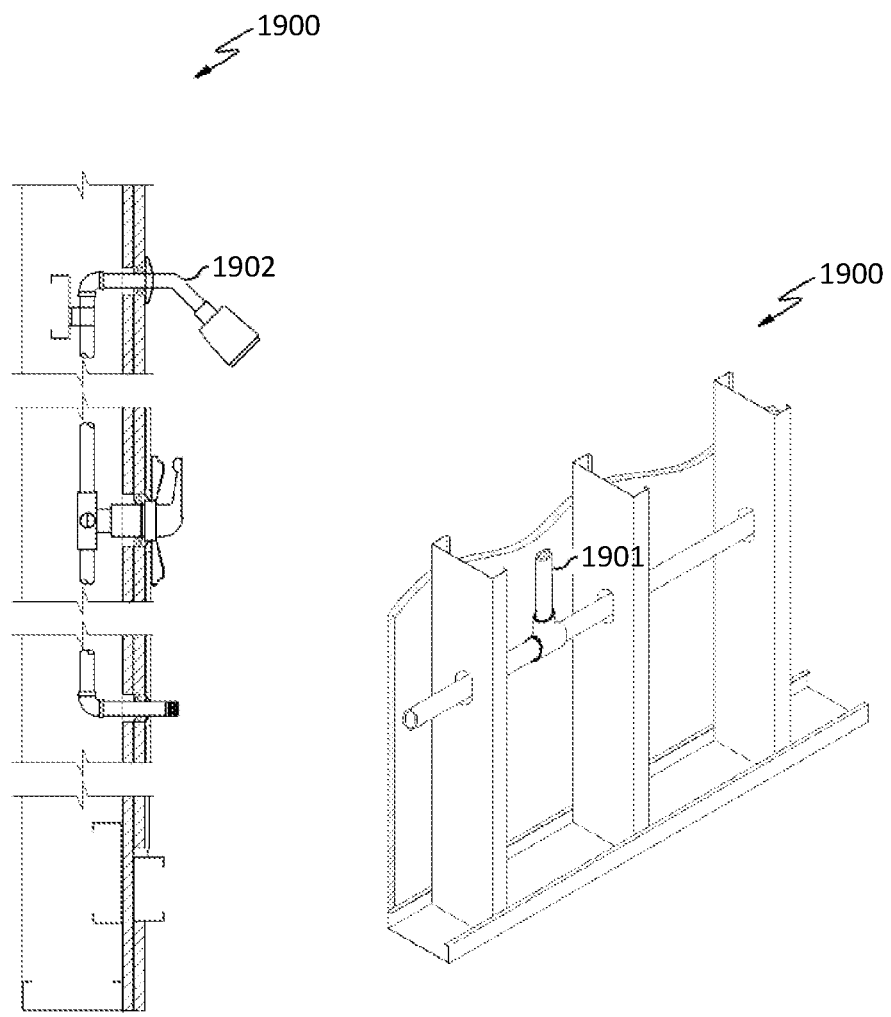
FIGS. 19A-B depicts a plumbing sub system in the building, in accordance with one embodiment of the present invention.

FIGS. 19A-B depicts a plumbing sub system in a wall 1900, in accordance with one embodiment of the present invention. In the depicted embodiments, the members are a cut or altered to allow for piping 1903 and 1902 to easily be installed within the wall, and without any conflict with the members. The program is able to determine, based on the model design or regulations, can generate the necessary modifications to the members to allow the plumbing system to be easily installed, and without the need to make any additional modifications to the members. These openings or cuts are at the desired locations, heights, and distance apart to conform with all regulations.

In some embodiments, the sick list is identified as a table of all members which are in conflict similar to a parts list which is used in various 3D design programs and interfaces. In additional embodiments, the sick list may be a table which identifies all of the members of the assembly and highlights or colors the members or the variables of the members which are in conflict. In some embodiments, the sick list lists all of the members in conflict, and further identifies the measurement or section of the member which is in conflict. For example, if a member is six (6) inches to tall to fit within the assembly, the members height measurement is identified in red and calculates a value of −6 inches in the height column to show how to correct the conflict, by amending the height of the member by 6 inches. In these embodiments, where the solution to correct the conflict can be calculated, machine learning technology can be implemented to automatically correct these conflicts.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

The foregoing descriptions of various embodiments have been presented only for purposes of illustration and description. They are not intended to be exhaustive or to limit the present invention to the forms disclosed. Accordingly, many modifications and variations of the present invention are possible in light of the above teachings will be apparent to practitioners skilled in the art. Additionally, the above disclosure is not intended to limit the present invention. In the specification and claims the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g. attached, adhered, joined) are to be construed broadly and may include intermediate members between a connection of elements and relative movement between elements. As such, joinder references do not necessarily infer that two elements are directly connected and in fixed relation to each other. Moreover, network connection references are to be construed broadly and may include intermediate members or devices between network connections of elements. As such, network connection references do not necessarily infer that two elements are in direct communication with each other. In some instances, in methodologies directly or indirectly set forth herein, various steps and operations are described in one possible order of operation, but those skilled in the art will recognize that steps and operations may be rearranged, replaced or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to the embodiments outlined above, various alternatives, modifications, variations, improvements and/or substantial equivalents, whether known or that are or may be presently foreseen, may become apparent to those having at least ordinary skill in the art. Listing the steps of a method in a certain order does not constitute any limitation on the order of the steps of the method. Accordingly, the embodiments of the invention set forth above are intended to be illustrative, not limiting. Persons skilled in the art will recognize that changes may be made in form and detail without departing from the spirit and scope of the invention. Therefore, the invention is intended to embrace all known or earlier developed alternatives, modifications, variations, improvements and/or substantial equivalents.

What is claimed is:

1. A computer-implemented method comprising:
receiving, by one or more processors, a model of a building associated with required regulations, the model comprise of a plurality of assemblies, and each assembly comprise of a plurality of members;

analyzing, by the one or more processors, each of the plurality of members for internal conflicts; wherein the internal conflict is determined based on a connection of a series of members and the required regulations;

analyzing, by the one or more processors, each of the plurality of members for member-to-member conflicts;

analyzing, by the one or more processors, each of the plurality of assemblies that has not member-to-member conflict for assembly-to-assembly conflicts, wherein an assembly-to-assembly conflict involve at least one member of each of the assemblies involved in the internal conflict;

analyzing, by the one or more processors, the members of the assemblies involved in the assembly-to-assembly conflicts;

identifying, by the one or more processors, each of the members involved in the at least one of member-to-member conflict and assembly-to-assembly conflict as conflicting members, wherein each the identified conflicting members are marked in the model;

analyzing, by the one or more processors, each of the member of the plurality of assemblies that are identified as non-conflicting members with mating assemblies or mating members for mating conflicts; wherein the mating conflict is determined when the assemblies and individual member are not properly mate based on required tolerance and bearing area which thereby results in a unsafe building;

generating, by the one or more processors, a list of all the members involved in the at least one of member-to-member conflict, assembly-to-assembly conflict and mating conflicts;

determining, by the one or more processors, a solution to correct the members involved in the at least one of member-to-member conflict, assembly-to-assembly conflict and mating conflicts by using a machine learning algorithm;

and implementing the solution into the model to conform the required regulations.

2. The computer- implemented method of claim 1, further comprising, marking, by the one or more processors, the members involved in the at least one of member-to-member conflict, assembly-to-assembly conflict and mating conflicts, wherein the conflicting members are distinguished from non-conflicting members.

3. The computer-implemented method of claim 1, further comprising, integrating, by the one or more processors, a sub-system into the model.

4. The computer-implemented method of claim 3, further comprising, analyzing, by the one or more processors, the plurality of members which interact with the installation of the sub-system, and determining if at least one of the plurality of member conflicts with the sub-system.

5. The computer-implemented method of claim 4, further comprising, modifying, by the one or more processors, the at least one of the plurality of members which conflict with the sub-system.

6. A computer program product, the computer program product comprising a non-transitory computer readable storage medium having program instructions embodied therewith, the program instructions executable to cause the computing device to:

receive a model of a building associated with required regulations, wherein the model comprise a plurality of assemblies and each assembly comprise a plurality of members;

analyze each of the members individually and each of the members related to the respective assembly, wherein the analysis compares an actual location of the members and the assemblies to a required location of the members and the assemblies;

identify an internal conflict where there is a discrepancy between the actual location and the required location of the members and the assemblies; wherein the internal conflict is determined based on a connection of a series of members and the required regulations;

analyze each of the internal conflicts of the members;

mark each of the members involved in the identified internal conflict as conflicting members;

analyzing, by the one or more processors, each of the member of the plurality of assemblies that are identified as non-conflicting members with mating assemblies or mating members for mating conflicts; wherein the mating conflict is determined when the assemblies and individual member are not properly mate based on required tolerance and bearing area which thereby results in a unsafe building;

generate a list of all conflicting members;

determining a solution to correct the at least one conflicting members based on a machine learning algorithm; wherein the conflict members are adjusted to adhere to the required location;

and implement the solution into the model to conform the required regulations.

7. The computer program product of claim 6, further comprising, forming a set of assemblies from the set of members, wherein the assemblies are walls, floors, and roofing components of the model.

8. The computer program product of claim 7, further comprising, analyze an interface between at least two assemblies.

9. computer program product of claim 6, further comprising, analyze the model and at least one sub-system, wherein each sub-system has a set of components and determining if the set of members conflict with any of the components of the sub-system.

10. The computer program product of claim 6, further comprising, assessing an interface between the sets of assemblies, wherein it is determined if any assemblies conflict with other assemblies, and if a conflict is discovered identifying the members of the assemblies which are conflicting.

11. The computer program product of claim 10, further comprising, determining if the members of the conflicting assemblies are to be adjusted or if the assembly is to be adjusted, and adjusting the members or the assembly.

12. A system comprising:

a CPU, a computer readable memory and a computer readable storage medium associated with a computing device;

program instructions to identify a plurality of members and a plurality of assemblies of a model of a building associated with required regulations, wherein each assembly comprise of a set of members;

program instructions to analyze each member of the model and determine if any members have an internal conflict, wherein the internal conflict is determined based on a connection of a series of members and the required regulations;

program instructions to analyze each relationship between the set of members, and determine if any of the relationships result in the internal conflict, program instructions to analyze each relationship between each of the assemblies, and determine if any of the relationships between each of the assemblies result in the internal conflict;

program instructions to analyze each member of the assemblies that are identified as non-conflicting members with mating assemblies or mating members for mating conflicts; wherein the mating conflict is determined when the assemblies and individual member are not properly mate based on required tolerance and bearing area which thereby results in a unsafe building;

program instructions to mark the conflicting members, and assemblies which are involved in the internal conflict and mating conflict;

program instructions to generate a list of members and assemblies that are associated with the internal conflict and mating conflicts;

program instructions to determine a solution to correct the members involved in the internal conflict or mating conflicts by using a machine learning algorithm;

program instructions to implement the solution into the model to conform the required regulations;

and program instructions to generate a report of the coloction of conflicting members and the types of conflicts which resolved.

13. The system of claim 12, further comprising, program instructions to incorporating sub-systems into the model and analyzing the members to determine if they conflict with the sub-system.

14. The system of claim 12, further comprising, program instructions to identify, assemblies within the model, wherein the assemblies are comprised of at least two members.

* * * * *